(12) United States Patent
Okada

(10) Patent No.: US 7,112,526 B2
(45) Date of Patent: Sep. 26, 2006

(54) MANUFACTURING OF A SEMICONDUCTOR DEVICE WITH A REDUCED CAPACITANCE BETWEEN WIRINGS

(75) Inventor: Makoto Okada, Kanagawa (JP)

(73) Assignee: NEC Electronics Corporation, (JP)

( * ) Notice: Subject to any disclaimer, the term of this patent is extended or adjusted under 35 U.S.C. 154(b) by 184 days.

(21) Appl. No.: 10/757,172

(22) Filed: Jan. 14, 2004

(65) Prior Publication Data
US 2004/0147106 A1  Jul. 29, 2004

(30) Foreign Application Priority Data
Jan. 17, 2003  (JP) ............... 2003-009184

(51) Int. Cl.
*H01L 21/4763* (2006.01)
*H01L 21/44* (2006.01)

(52) U.S. Cl. ............ 438/622; 438/631; 438/637; 438/675

(58) Field of Classification Search ............ 438/622, 438/631, 637, 675
See application file for complete search history.

(56) References Cited

U.S. PATENT DOCUMENTS

| | | | |
|---|---|---|---|
| 6,035,530 A * | 3/2000 | Hong ............ | 29/885 |
| 6,064,118 A * | 5/2000 | Sasaki ............ | 257/758 |
| 6,159,845 A * | 12/2000 | Yew et al. ............ | 438/637 |
| 6,406,992 B1 * | 6/2002 | Mao et al. ............ | 438/622 |
| 6,917,109 B1 * | 7/2005 | Lur et al. ............ | 257/758 |
| 2001/0042863 A1 * | 11/2001 | Yamada et al. ............ | 257/78 |

FOREIGN PATENT DOCUMENTS

| | | |
|---|---|---|
| JP | 10-335459 | 12/1998 |
| JP | 2000-183158 | 6/2000 |
| JP | 2000-208621 | 7/2000 |
| JP | 2001-085519 | 3/2001 |

OTHER PUBLICATIONS

Bhusari, et al. "Fabrication of Air-Gaps Between Cu Interconnects for Low Intralevel k" D4. 8 MRS symposium proceedings vol. 612, 2000.

* cited by examiner

*Primary Examiner*—William M. Brewster
(74) *Attorney, Agent, or Firm*—Hayes Soloway P.C.

(57) ABSTRACT

In the method of manufacturing a semiconductor device, via holes and first trenches to form air gaps are concurrently formed in a first insulating film on a semiconductor substrate and a second insulating film is formed thereon. Thereafter, the second insulating film lying outside the area corresponding to the regions where the first trenches to form air gaps are formed is partially removed to form trenches for wiring by using a mask. A plurality of wirings are formed by filling in the trenches for wiring with a metal film. The second insulating film remaining in the regions where the first trenches to form air gaps are formed is then removed to form second trenches to form air gaps. Subsequently, in forming a third insulating film, air gaps are formed within the second trenches to form air gap.

9 Claims, 5 Drawing Sheets

MANUFACTURING OF A SEMICONDUCTOR DEVICE WITH A REDUCED CAPACITANCE BETWEEN WIRINGS

BACKGROUND OF THE INVENTION

1. Field of the Invention

The present invention relates to a method of manufacturing a semiconductor device.

2. Description of the Related Art

To reduce parasitic capacitance between wiring when fabricating semiconductor devices with multi-layered wiring structures on a semiconductor substrate, a low-dielectric-constant material has heretofore been used as the interlayer insulating film or air gaps (cavities) are formed between wiring.

The latter is disclosed, for example, in Japanese Patent Application Laid-open No. 85519/2001. In this publication, wirings having a reversed taper configuration on a sacrifice layer are formed made up of, for example, PSG (Phosphorous Silicate Glass) and the sacrifice layer is removed by dry etching or wet etching to thereby form air gaps between wirings.

Japanese Patent No. 3102382 discloses a semiconductor device and a method of manufacturing the same in which openings of via holes and opening between wirings are concurrently formed to form cavities on the insulating portions between the wirings.

However, in the conventional method wherein air gaps are formed after formation of the wirings, a mask of a photoresist film or the like is formed and interlayer insulating films between wirings are removed to form trench to form air gaps by means of etching. The use of a mask to form trenches to form air gap results in a significant increases in the number of processes.

Unlike this, the removal of the interlayer insulating film by dry etching without forming a mask may damage the wirings.

Moreover, as shown in FIGS. 1A and 1B, if an interlayer insulating film 1 is selectively removed by wet etching without forming a mask, shape after the etching becomes difficult to control. When overetching results, as shown in FIG. 1A, the interlayer insulating film 1 having via holes formed therein becomes irregularly shaped, and thus the supporting leg for the wiring 5 or the interlayer insulating film 1 between the wirings 5 may disappear.

On the other hand, if underetching occurs after the interlayer insulating film 1 is selectively removed by wet etching, as shown in FIG. 1B, interlayer insulating film 6 in which air gaps 9 are to be formed may take the shape of irregular tapers. As a result, even if via holes are formed in the wirings 5 and of low filling-up capability (i, e, the recesses are difficult to be filled up) to deposit an interlayer insulating film 6 therein, uniform air gaps 9 cannot be obtained.

Further, the use of a low-dielectric-constant material as a interlayer insulating film often makes a difference in etching selectivity for the etchant between the interlayer insulating film and its underlying layer small. This requires for an etching stopper film to be formed between the interlayer insulating film and its underlying layer. This in turn deteriorates the adhesiveness between layers and increases the parasitic capacitance between wirings despite the use of the low-dielectric-constant material as the interlayer insulating film.

SUMMARY OF THE INVENTION

In view of the foregoing known problems, it is an object of the present invention to provide a method of manufacturing a semiconductor device having a reduced parasitic capacitance between wirings.

Another object of the present invention is to provide a method of manufacturing a semiconductor device having a reduced capacitance between wirings in which the number of process step is reduced to simplify the process step. A further object of the present invention is to provide a method of stable manufacturing the semiconductor device.

According to the present invention, there is provided a method of manufacturing a semiconductor device comprising the steps of: forming a first insulating film on a semiconductor substrate; forming a first trench in the first insulating film; forming a second insulating film over the entire surface of the semiconductor substrate so as to fill up the first trench; forming a plurality of second trenches in an area excluding a region immediately above the first trench by removing the second insulating film selectively; forming a metal film so as to fill in the second trenches for forming a plurality of wirings by removing the metal film lying outside the second trenches for forming a third trench by removing the second insulating film lying above the first trench and the second insulating film lying in the trench and forming a third insulating film over the entire surface of the semiconductor substrate so as to form a cavity within the third trench to form air gaps.

The preformation of a first trench allows air gaps with substantially uniform shapes to be formed accurately. This makes it possible to stably manufacture a semiconductor devices having a reduced capacitance between wirings. An area excluding a region immediately above the first trench as used herein may include at least a part of the area that excludes a region immediately above the first trench.

The step of forming a third trench to form air gaps may include removing the second insulating film throughout the entire region between the wirings. This allows a third trench to form air gaps to be formed throughout the entire region between the wirings, thereby further reducing the capacitance between the wirings.

The step of forming a first trench may include forming a via hole together with the first trench, in a region of the first insulating film other than the region where the first trench is formed. The step of forming a plurality of second trenches may include connecting the second trenches to the via holes. The step of forming a metal film may include filling it in the via holes together with the second trenches.

Thus, forming a first trench together with via holes reduces the number of process steps wherein a mask of a photoresist or the like is used. This leads to a significant decrease in the number of process steps in manufacturing a semiconductor device and simplify the method of manufacturing.

In the step of forming the third trench may have the thickness substantially equal to the total thickness of a via hole and a wiring.

Forming such a third trench enables air gaps with substantially uniform shapes to be formed accurately. This makes it possible to stably manufacture a semiconductor device having a reduced capacitance between wirings.

In the step of forming a third trench, the third trench may be formed such that its sidewalls may generally be perpendicular to the bottom surface of the first trench.

Forming such a third trench enables air gaps with substantially uniform shapes to be formed accurately. This makes it possible to stably manufacture a semiconductor device having a reduced a capacitance between wirings.

The metal film may contain copper, and, before the step of forming a metal film, the step of forming a barrier metal film to cover the internal surfaces of the via holes and the second trenches may further be provided. The wiring may be constituted by a metal film and a barrier metal film, and, in this case, the barrier metal film lying outside the second trenches may be removed together with the metal film.

In the step of forming a third trench, the second insulating film may be removed in a trench configuration along the region where the first trench is formed.

The second insulating film herein may be removed using a mask. A photoresist film may be utilized as the mask in this case. A trench can be formed along the region where the first trench is formed, immediately above the first trench, to thereby form a third trench together with the first trench. This allows air gaps with substantially uniform shapes to be formed accurately.

In the step of forming a third trench, the second insulating film may be removed by using an etchant to selective removing the insulating film selectively on the metal film without using a mask. As the second insulating film, for instance, polyimide, especially photosensitive polyimide, may be utilized. As an etchant, hereat, hydrazine, for example, may be used. Thus, the second insulating film alone is removed selectively without using a mask. As a result, in the step of forming a third trench, a third trench whose sidewalls are generally perpendicular to the bottom surface can be formed, thereby preventing an increase in the number of steps and damage to the wirings, which are serious problems for the conventional methods. Since overetching and underetching in the conventional methods above with reference to FIGS. 1A and 1B can also be solved, uniform air gaps can be obtained.

The third insulating film may be made of a low-dielectric-constant material. A low-dielectric-constant material as used herein denotes a material with a dielectric constant of 3.6 or less.

As a low-dielectric-constant material, a film containing a ladder oxide such as a ladder hydrogenated siloxane may be used. The ladder hydrogenated siloxane refers to a polymer with the ladder molecular structure. It's dielectric constant of 2.9 or less is particularly preferable from the viewpoint of the wiring delay suppression. Preferably, it also has a low film density. As an example of such a film material, L-Ox (the trade name) can be given. In addition to this, any one of various materials including, for example, polyorganosiloxanes such as HSQ (hydrogen silsesquioxane), MSQ (methylsilsesquioxane), and MHSQ (methylated hydrogen silsesquioxane); aromatic organic materials such as polyallyl ether (PAE), divinylsiloxane-bis-benzocyclobutene (BCB), and SiLK (a registered trademark); SOG (Spin On Glass); FOX (Flowable Oxide); Parylene (polyparaxylene); Cytop; and BCB (benzocyclobutene) may be used as the low-dielectric-constant material. This accomplishes further reduction in the capacitance between the wirings.

According to the present invention, there is provided a method of manufacturing a semiconductor device comprising the steps of; forming an insulating film on a semiconductor substrate; forming a plurality of first trenches for wirings by removing the insulating film selectively; forming a metal film so as to fill in the first trenches for wirings; forming a plurality of wirings by removing the metal film lying outside the first trenches for wirings; and forming a second trench by removing the insulating film throughout the entire region between the wirings.

After the second trench have been formed in this manner, an interlayer insulating film (a third insulating film) made of a low-dielectric-constant material is formed above the second trench as well as between the wirings, as described below. This results in the simplification the method of manufacturing a semiconductor device having a reduced capacitance between wirings.

The step of forming an interlayer insulating film over the entire obverse surface of the semiconductor substrate may be further comprised after the step of forming a second trench. The interlayer insulating film may be made of such a low-dielectric-constant material as described above. This allows to manufacture a semiconductor device having a reduced capacitance between wirings. The interlayer insulating film may be formed so as to fill up the trench as a whole. This allows the use of a low-dielectric-constant material as the interlayer insulating film, without providing an etching stopper film between a layer having wiring formed thereon and a layer lying thereunder, resulting in a significant decrease in a capacitance between wirings. Moreover, the adhesiveness between layers (or films) can be improved.

The interlayer insulating film may be formed so as to form a cavity within the second trench.

This allows the reduction in the capacitance between the wirings. Further, in this case, the interlayer insulating film herein may also be made of such a low-dielectric-constant material as described above, reducing the capacitance between the wirings.

In the step of forming a second trench, the insulating film may be removed using an etchant to selective removing the insulating film on the metal film without using a mask. As the insulating film, for instance, polyimide, especially photosensitive polyimide, may be utilized. As an etchant, hereat, hydrazine, for example, may be used. Thus, the insulating film alone is removed selectively without using a mask. As a result, in the step of forming a second trench, a second trench whose sidewalls are generally perpendicular to the bottom face can be formed and, thereby solving the problems in the conventional methods, uniform air gaps can be obtained.

The above and other objects, features and advantages of the present invention will become apparent from the following description with reference to the accompanying drawings which illustrate examples of the present invention.

DESCRIPTION OF THE PREFERRED EMBODIMENTS

First Embodiment

FIGS. 2A to 4B are schematic cross-sectional views illustrating the steps of a method of manufacturing a semiconductor device according to the first embodiment of the present invention. The steps of forming a multi-layered wiring structure by the dual damascene method are described below.

Firstly, on a semiconductor substrate 100, a first insulating film 102 (for example, with a thickness of 800 nm) is formed. The first insulating film 102, for example, may be made of a silicon oxide film. It is also possible for the first insulating film 102 to be composed of what is called a low-dielectric-constant material.

As a low-dielectric-constant material, various materials may be utilized and it is preferable to contain a ladder oxide such as a ladder hydrogenated siloxane therein. The ladder hydrogenated siloxane is a polymer with the ladder molecular structure, and preferably has a dielectric constant of 2.9 or less from the viewpoint of the wiring delay suppression. Preferably, it also has a low film density. As an example of such a film material, L-Ox (the trade name) may be used. In addition to this, any one of various materials including, for example, polyorganosiloxanes such as HSQ (hydrogen silsesquioxane), MSQ (methylsilsesquioxane), and MHSQ (methylated hydrogen silsesquioxane); aromatic organic materials such as polyallyl ether (PAE), divinylsiloxane-bis-benzocyclobutene (BCB), and SiLK (a registered trademark); SOG (Spin On Glass); FOX (Flowable Oxide); Parylene (polyparaxylene); Cytop; and BCB (benzocyclobutene) may be used for the low-dielectric-constant material.

Figure 2A:
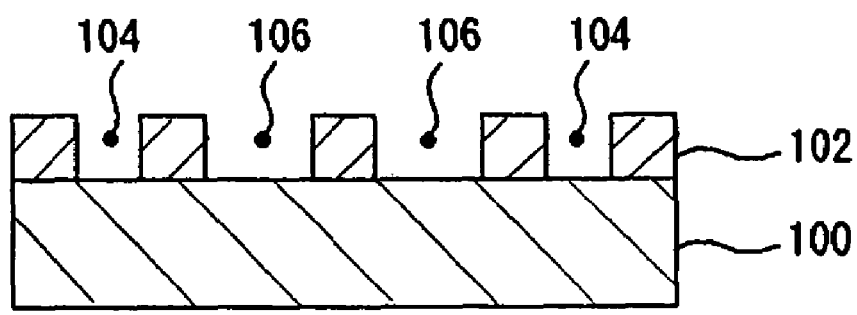
FIGS. 2A to 2C are schematic cross-sectional views illustrating the steps of a method of manufacturing a semiconductor device according to the first embodiment of the present invention.

In the first insulating film 102, via holes 104 (for example, with a diameter of 1 μm) and first trenches to form air gaps 106 (for example, with a width of 1.12 μm) are then formed (see FIG. 2A). These via holes 104 and first trenches to form air gaps 106 may be formed, for example, through dry etching, using a mask of a photoresist film or the like (not shown in the drawings) which is patterned to prescribed places. The pattern formed in the photoresist film is such that via holes 104 and first trenches to form air gaps 106 do not overlap with one another.

Figure 2B:
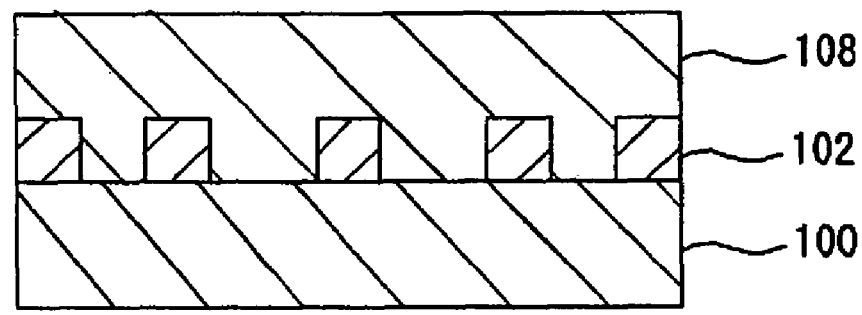

Next, onto the semiconductor substrate 100 where the first insulating film 102 is formed, a second insulating film 108 (its flat sections overlying the first insulating film 102 is, for instance, about 800 nm thick) is applied so as to fill in the via holes 104 and the first trenches to form air gaps 106 (see FIG. 2B). Since trenches for wiring are to be formed in the second insulating film 108 as described below, the thickness of the second insulating film 108 is preferably set after the thickness of the wiring is considered. The second insulating film 108 may be made of a material that is removable by etching after forming the wiring, such as photosensitive polyimide.

Figure 2C:
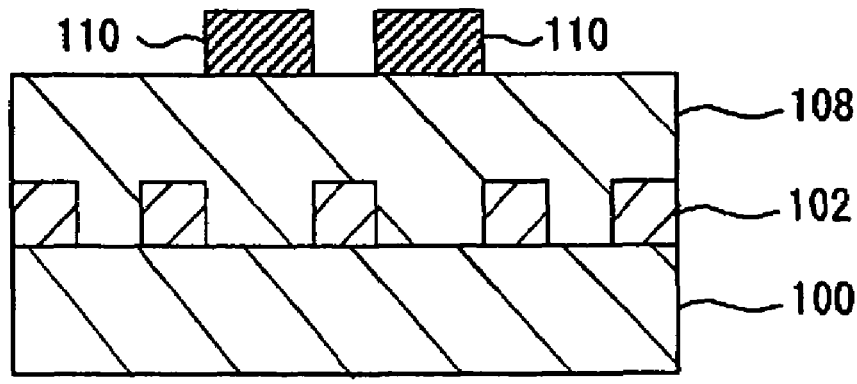

Thereafter, on the second insulating film 108, a mask 110 is formed and patterned corresponding to the regions where, as shown in FIG. 2A, the first trenches to form air gaps 106 are formed (see FIG. 2C). As the mask 110, an ordinary photoresist film may be used. Alternatively, another arrangement wherein, instead of forming the mask 110, the second insulating film 108 is utilized as a mask.

The second insulating film 108 is then partially removed by conducting dry etching or wet etching with the mask 110. While portions of the second insulating film 108 filling up via holes 104 are removed by this etching, sacrifice films 112 are left and, at the same time, trenches for wirings 113 (for instance, with a width of 1.12 μm) connecting to the via holes 104 are formed (see FIG. 3A). The sacrifice films 112 constitute the sidewalls of the trenches for wiring 113. If photosensitive polyimide is utilized for the second insulating film 108, portions of the second insulating film 108 filling up the via holes 104 can be removed through the exposure and the development of the second insulating film 108 to form the trenches for wirings 113. On this occasion, the second insulating film 108 is baked, for example, at 150° C. or so.

Figure 3A:
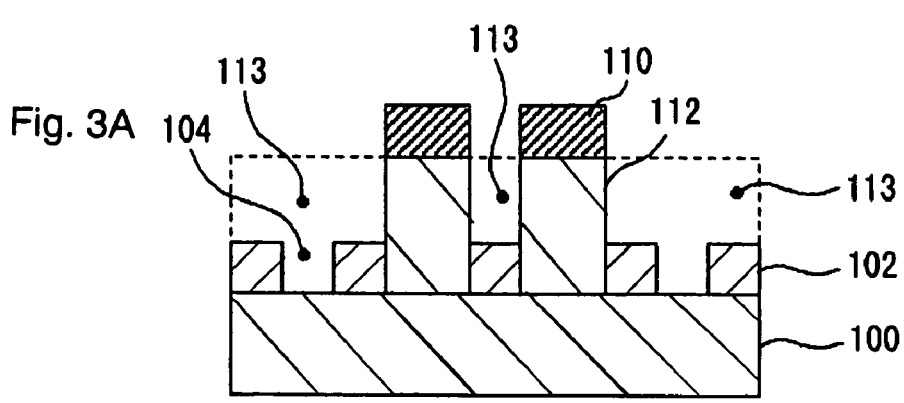
FIGS. 3A to 3E are schematic cross-sectional views illustrating further steps of the method of manufacturing a semiconductor device according to the first embodiment of the present invention.
Figure 3B:
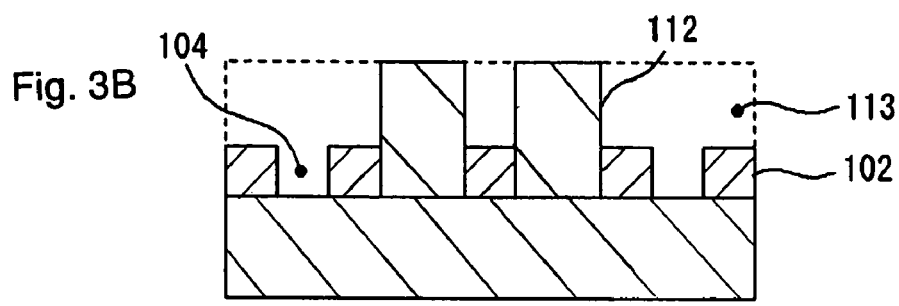
Figure 3C:
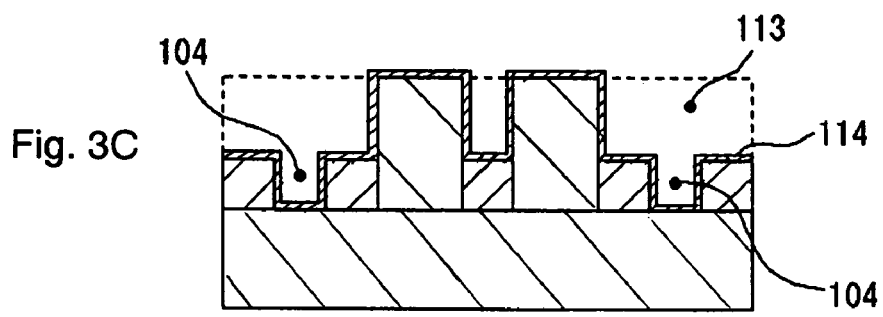

Next, the mask 110 is removed (see FIG. 3B). After that, a barrier metal film 114 is formed to cover the entire surface of the semiconductor substrate 100 and the internal surfaces of the via holes 104 and the trenches for wirings 113 is formed (see FIG. 3C). Examples of a preferable barrier metal film 114 include, for instance, Ti, TiN, W, WN, Ta, TaN, or the like. The barrier metal film 114 of the present embodiment contains a metal having a high melting point such as Ti, W, or Ta. A tantalum-based barrier metal having layers of TaN and Ta is particularly preferably used. For instance, when Ta/TaN is used as the barrier metal film 114, their film thickness may be set to be approximately 20 nm/20 nm. The barrier metal film 114 may be formed by the sputtering method, the CVD (Chemical Vapor Deposition) method, or the like.

Figure 3D:
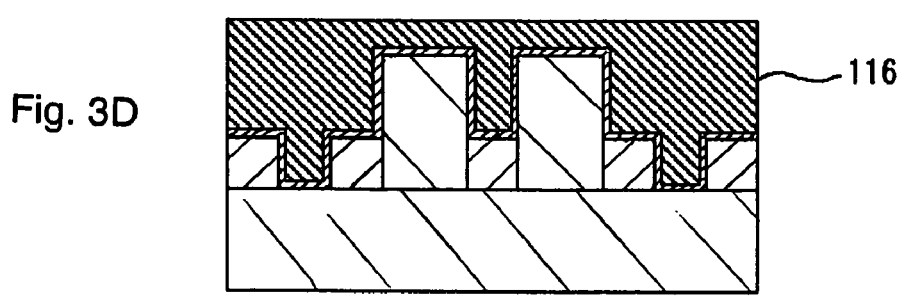
Figure 3E:
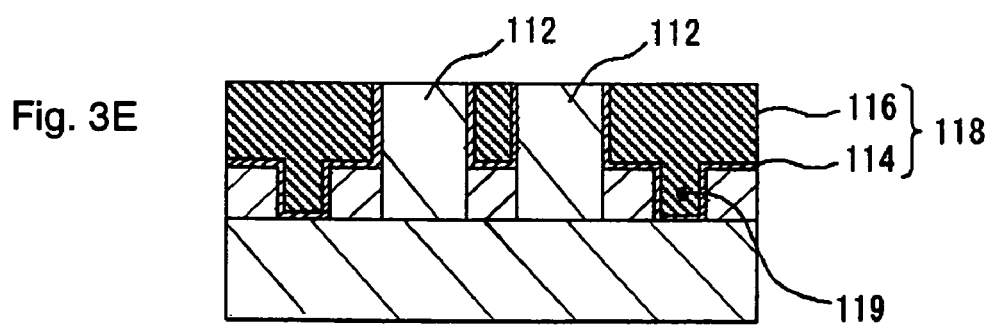
Figure 4A:
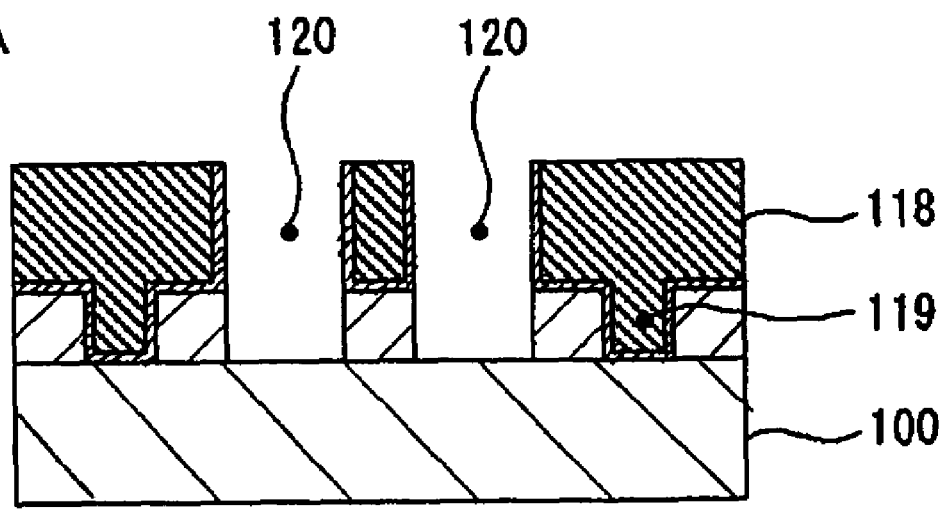
FIGS. 4A and 4B are schematic cross-sectional views illustrating further steps of the method of manufacturing a semiconductor device according to the first embodiment of the present invention.
Figure 4B:
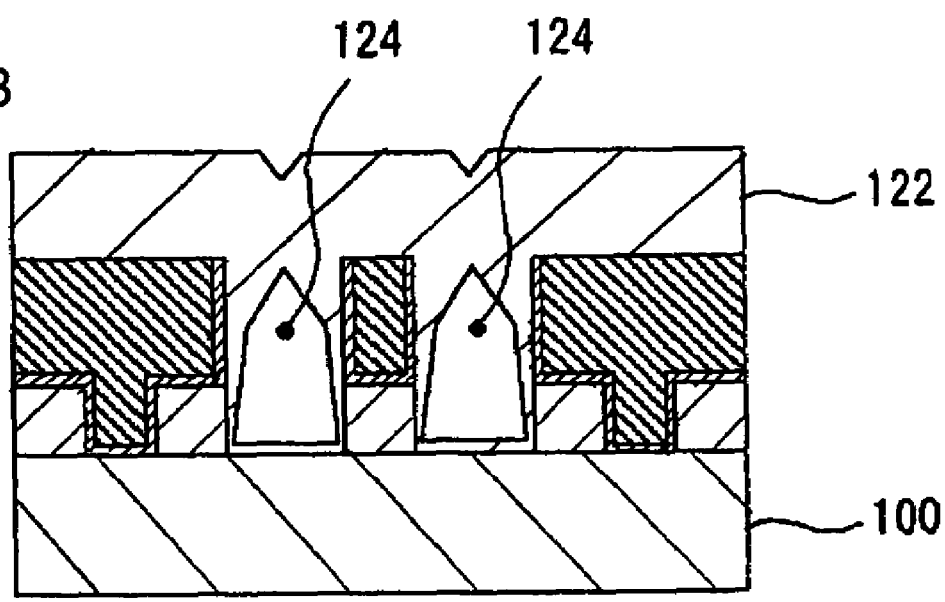

Subsequently, a metal film 116 is formed so as to fill in the via holes 104 and the trenches for wirings 113 (see FIG. 3D). The metal film 116 may be formed with copper for its main component, and, for example, by the plating method as described below. Firstly, a copper seed film, which is to provide copper for the copper plating growth, is deposited thereon by the sputtering method. Next, immersing the substrate into an aqueous solution of copper sulfate at a temperature of about 25° C., the metal film 116 is formed by the electroplating method.

After that, an annealing treatment may be possibly carried out, for example, for 30 minutes or so at a temperature not lower than 200° C. but not higher than 500° C. Such a treatment can increase the size of grains in the metal film 116 so that the stressmigration resistance of the metal film 116 can be raised and, at the same time, the value of electric resistance of the metal film 116 can be lowered.

The chemical mechanical polishing (CMP) is then applied in order to remove superfluous portions of the barrier metal film 114 and the metal film 116 that are grown outside the trenches for wirings 113 and make the planarization of their surface. The barrier metal film 114 and the metal film 116 are left only on the inside of the via holes 104 and the trenches for wirings 113, whereby wirings 118 are formed (see FIG. 3E). Via plugs 119 and wirings 118 are hereat concurrently formed by the dual damascene method.

Figure 1A:
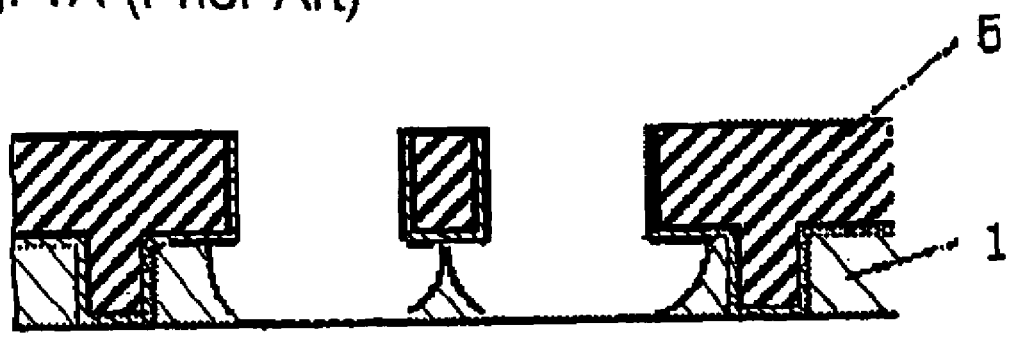
FIGS. 1A and 1B are schematic cross-sectional views each illustrating the structure of a conventional semiconductor device in which air gaps are formed.
Figure 1B:
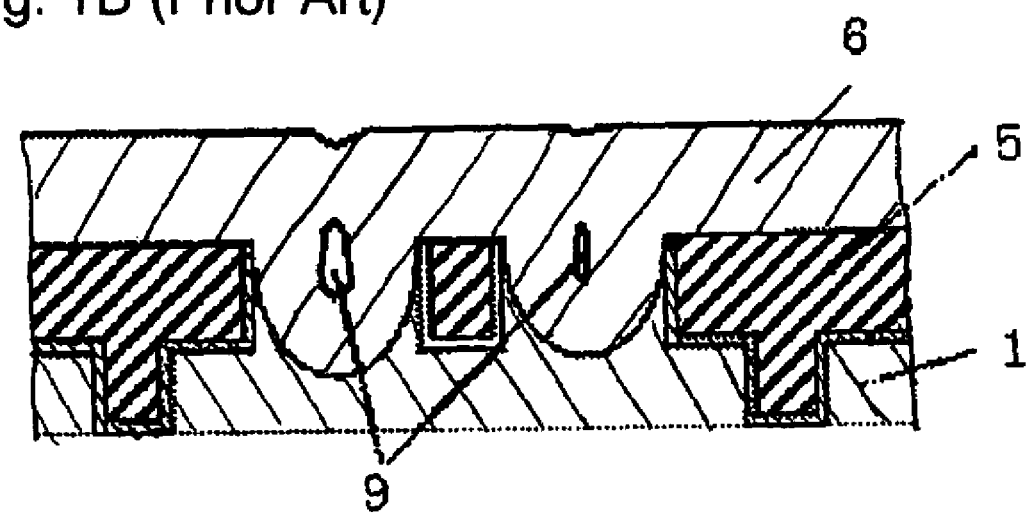

After that, the sacrifice films 112 are selectively removed by performing, for example, wet etching with an etchant such as hydrazine. Thereafter, extending over the layer having the via plugs 119 formed thereon and the layer having the wirings 118 formed thereon, second trenches to form air gaps 120, whose sidewalls are generally perpendicular to the bottom face of the first trenches to form air gaps 106 (see FIGS. 2A to 2C), are formed (see FIG. 4A). In the present embodiment, the sacrifice films 112 are preferably made of a material which has a sufficient etching selectively with respect to the metal film 116 in the wet etching. This makes it possible to form the second trenches to form air gaps 120 whose sidewalls are substantially perpendicular to the bottom surface without using a mask. In this way, an increase in the number of process steps and the damage to the wirings, which are serious problems for the conventional methods, may be prevented from occurring. Since overetching and underetching in the conventional methods above with reference to FIGS. 1A and 1B can be solved, uniform air gaps can be obtained.

Next, a third insulating film 122 is formed over the entire surface of the semiconductor substrate 100 under the condition that low filling-up capability is obtained so as to fill in only the top portions in the second trenches to form air gaps 120. Air gaps 124 are thereby formed to extend through the layer having the via plugs 119 formed thereon and the layer having the wirings 118 formed thereon (see FIG. 4B). The third insulating film 122 may be formed by the plasma CVD method using, for example, $SiH_4$, $O_2$, Ar gas, or the like. Low filling-up capability may be obtained, for instance, by decreasing the applied bias voltage and lowering the RF (Radio Frequency) power and, in consequence, reducing the filling-up capability. The third insulating film 122 may be also made of a low-dielectric-constant material, which has been described above.

After that, the third insulating film 122 is polished to a prescribed thickness (for example, 200 nm) by the CMP to attain planarization, and through repetition of the aforementioned steps, a multi-layered wiring structure having air gaps 124 formed between the wirings may be formed.

It has been confirmed that such forming air gaps 124 between the wirings 118 in the first embodiment described above reduces the capacitance between wirings, for example, by approximately 20 to 25%, compared with the case that a silicon oxide film is used as the interlayer insulating film between the wirings.

According to the aforementioned method of manufacturing a semiconductor device of the preferred embodiment of the present invention, when the air gaps between the wirings are formed, it is not required to add the step of forming another photoresist film to fabricate second trenches to form air gaps 120 so that the steps thereof can be simplified. Through the use of the mask 110 patterned corresponding to the regions where the first trenches to form air gaps 106 are formed, it is possible to form air gaps extending over the layer having the wirings 118 formed thereon and the layer having via plugs 119 formed thereon. In the present embodiment, since the lower portions of the second trenches to form air gaps 120 are the first trenches to form air gaps 106 that are formed by dry etching at the same time as the via holes 114 are formed, the sidewalls of the second trenches to form air gaps 120 can be made generally perpendicular to the bottom surface of the first trenches to form air gaps 106. This reduces the degree of irregularity in the shape of air gaps 124 and, thus, enables the stably fabrication of the semiconductor device. Further, because the sacrifice films 112 can be removed without using a mask, the steps in the method of manufacturing a semiconductor device can be simplified also from this point.

Second Embodiment

Figure 5A:
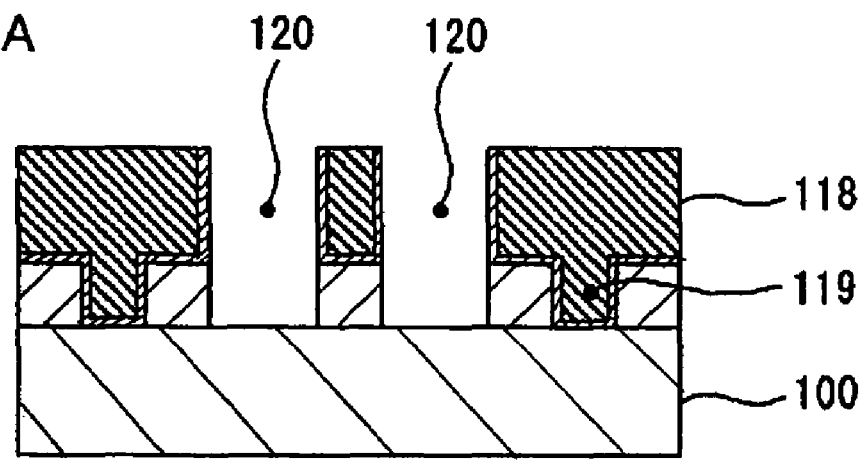
FIGS. 5A to 5C are schematic cross-sectional views illustrating the steps of a method of manufacturing a semiconductor device according to the second embodiment of the present invention.
Figure 5B:
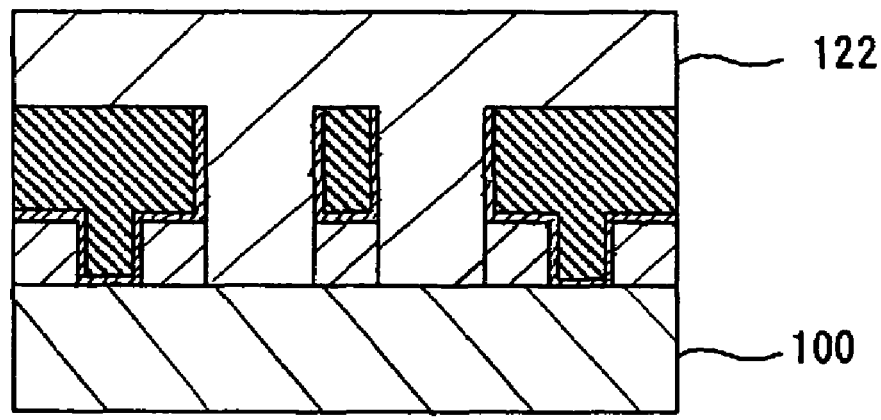
Figure 5C:
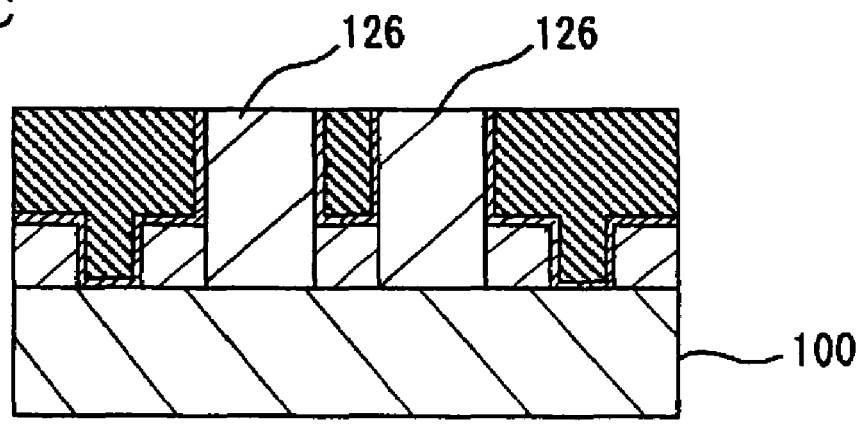

FIGS. 5A to 5C are schematic cross-sectional views illustrating a part of the steps of a method of manufacturing a semiconductor device according to the second embodiment of the present invention.

In the present embodiment, too, wirings 118, via plugs 119, and sacrifice films 112 are formed by the same method as described in the first embodiment with reference to FIGS. 2A to 3E. After that, as in the first embodiment, the sacrifice films 112 are selectively removed, for example, by selective wet etching with hydrazine, whereby, extending over the layer where the via plugs 119 are formed and the layer having the wirings 118 formed thereon, second trenches (same as the second trenches to form air gaps in the first embodiment) 120 whose sidewalls are generally perpendicular to the bottom face of the first trenches (same as the first trenches to form air gaps in the first embodiment) 106 (see FIGS. 2A to 2C) are formed (see FIG. 5A).

In the present embodiment, a third insulating film 122 is formed over the entire surface of the semiconductor substrate 100 so as to fill in the second trenches 120 (see FIG. 5B). The third insulating film 122 may be made of a low-dielectric-constant material described in the first embodiment. The third insulating film 122 is then polished. Interlayer insulating films 126 made of a low-dielectric-constant material are thereby formed, extending over the layer having via plugs 119 formed thereon and the layer having the wirings 118 formed thereon (see FIG. 5C). Through repetition of the above steps, forming a multi-layered structure wherein the interlayer insulating films 126 are formed between the wirings may be accomplished.

According to the aforementioned method of manufacturing a semiconductor device of the preferred embodiment of the present invention, after the sacrifice films 112 and then the wirings 118 are formed, the sacrifice films 112 are removed, the interlayer insulating films 126 of a low-dielectric-constant material are formed so that it is unnecessary to form an etching stopper film. This arrangement wherein the interlayer films 126 made of a low-dielectric-constant material are formed between the wirings 118 and etching stopper film is not utilized can reduce the capacitance between wirings. Since etching stopper film is not used, it is possible to improve the adhesiveness between the layers (or films).

First and second embodiments of the present invention have been described above. However, it is to be understood by person skilled in the art that these embodiments represent the preferred forms of the present invention for illustration and many other embodiments may be made through various changes in the combination and arrangement of constituent parts and operations in process steps, without departing from the spirit and scope of the present invention. Some of such modified embodiments are described below.

While the foregoing embodiments are described to comprise the step of forming a multi-layered wiring structure by the dual damascene method, the present invention obviously can be applied to a method in which a multi-layered wiring structure is formed by the single damascene method.

Further, although in the foregoing embodiments, examples of sizes such as widths for various construction parts are shown, the present invention is not limited thereto and, if the fabrication accuracy improves further, it is apparent that the present invention will be able to be applied to a method of manufacturing a semiconductor device with a minuter structure.

Further, polyimide is herein used as the material to constitute the sacrifice film 112, but, without being limited to this, any material capable to provide, at the time of etching, good etching selectively by the etchant with respect to the metal film 116 and the like which constitute the wirings 118 as well as with respect to the first insulating film 102, may be employed.

While preferred embodiments of the present invention have been described using specific terms, such description is for illustrative purposes only, and it is to be understood that changes and variations may be made without departing from the spirit or scope of the following claims.

The invention claimed is:

1. A method of manufacturing a semiconductor device comprising the steps of:
    forming a first insulating film on a semiconductor substrate;
    forming a first trench in said first insulating film;
    forming a second insulating film over the entire surface of said semiconductor substrate so as to fill up said first trench;
    forming a plurality of second trenches in an area excluding a region immediately above said first trench portion by removing said second insulating film selectively;
    forming a metal film so as to fill in said second trenches;
    forming a plurality of wirings by removing said metal film lying outside said second trenches;
    forming a third trench by removing said second insulating film lying above said first trench and said second insulating film lying in said trench; and
    forming a third insulating film over the entire surface of said semiconductor substrate so as to form a cavity within said third trench to form an air gap.

2. The method according to claim 1, wherein said step of forming a third trench to form an air gap comprises removing said second insulating film throughout the whole region between said wirings.

3. The method according to claim 1,
    wherein said step of forming a first trench comprises forming a via hole together with said first trench, in a region of said first insulating film other than the region where said first trench is formed,
    said step of forming a plurality of second trenches comprises connecting said second trenches to said via holes, and
    said step of forming a metal film comprises filling it in said via holes together with said second trenches.

4. The method according to claim 1, wherein said step of forming a third trench comprises removing said second insulating film along the region where said first trench is formed.

5. The method according to claim 1, wherein said step of forming a third trench comprises removing said second insulating film, by using an etchant capable of removing said insulating film selectively with respect to said metal film without using a mask.

6. The method according to claim 1, wherein said third insulating film is made of a low-dielectric-constant material.

7. A method of manufacturing a semiconductor device comprising the steps of:
    forming an insulating film on a semiconductor substrate;
    forming a plurality of first trenches for wirings by removing said insulating film selectively;
    forming a metal film so as to fill in said first trenches for wirings;
    forming a plurality of wirings by removing said metal film lying outside said first trenches for wirings;
    forming a second trench by removing said insulating film throughout the whole region between said wirings, thereby exposing a portion of the semiconductor substrate; and
    forming an interlayer insulating film over the entire surface of said semiconductor substrate after forming said second trench,
    wherein when said interlayer insulating film is disposed on said semiconductor substrate, a cavity is formed within said second trench.

8. A method of manufacturing a semiconductor device comprising the steps of:
    forming an insulating film on a semiconductor substrate;
    forming a plurality of first trenches for wirings by removing said insulating film selectively;
    forming a metal film so as to fill in said first trenches for wirings;
    forming a plurality of wirings by removing said metal film lying outside said first trenches for wirings;
    forming a second trench by removing said insulating film throughout the whole region between said wirings thereby exposing a portion of the semiconductor substrate; and
    forming an interlayer insulating film over the entire surface of said semiconductor substrate after forming said second trench,
    wherein said interlayer insulating film is made of a low-dielectric-constant material.

9. The method according to claim 7, wherein said step of forming a second trench comprises removing said insulating film by using an etchant capable of removing said insulating film selectively with respect to said metal film without using a mask.

* * * * *